United States Patent [19]

Ohno et al.

[11] Patent Number: 4,975,168

[45] Date of Patent: Dec. 4, 1990

[54] METHOD OF FORMING TRANSPARENT CONDUCTIVE FILM AND APPARATUS FOR FORMING THE SAME

[75] Inventors: Ichiro Ohno, Akishima; Junji Shiota; Hidetaka Uchiumi, both of Tachikawa, all of Japan

[73] Assignee: Casio Computer Co., Ltd., Tokyo, Japan

[21] Appl. No.: 339,474

[22] Filed: Apr. 17, 1989

[30] Foreign Application Priority Data

Apr. 20, 1988 [JP] Japan .................................. 63-97117

[51] Int. Cl.$^5$ ...................... C23C 14/54; C23C 14/56
[52] U.S. Cl. ......................... 204/192.13; 204/192.29; 204/298.03; 204/298.07; 204/298.25
[58] Field of Search ..................... 204/192.13, 192.29, 204/298 MT, 298 GF, 298 MC, 298.03, 298.07, 298.25

[56] References Cited

U.S. PATENT DOCUMENTS

| | | | |
|---|---|---|---|
| 4,172,020 | 10/1979 | Tisone et al. | 204/192.13 |
| 4,336,119 | 6/1982 | Gillery | 204/192.13 |
| 4,362,936 | 12/1982 | Hofmann et al. | 250/292 |
| 4,428,811 | 1/1984 | Sproul et al. | 204/192.13 |

OTHER PUBLICATIONS

F. H. Gillery, *J. Vac. Sci. Technol.*, vol. 15(2), Mar.-/Apr. 1978, pp. 306–308.

*Primary Examiner*—Aaron Weisstuch
*Attorney, Agent, or Firm*—Frishauf, Holtz, Goodman & Woodward

[57] ABSTRACT

A method of forming a transparent conductive thin film by sputtering includes the step of placing a target consisting of a conductive oxide material and a substrate on which the thin film is to be formed in a pressure vessel, the step of supplying argon gas and oxygen gas after the pressure vessel is substantially evacuated, the step of supplying a sputtering current to the target to maintain a discharge state, the step of detecting the partial pressure of oxygen in the gas mixture in the pressure chamber, and the step of controlling the flow rate of oxygen gas. The flow rate of the oxygen gas is controlled by a control unit such that the value of the partial pressure of oxygen which is detected in the partial pressure detection step is always kept constant.

18 Claims, 8 Drawing Sheets

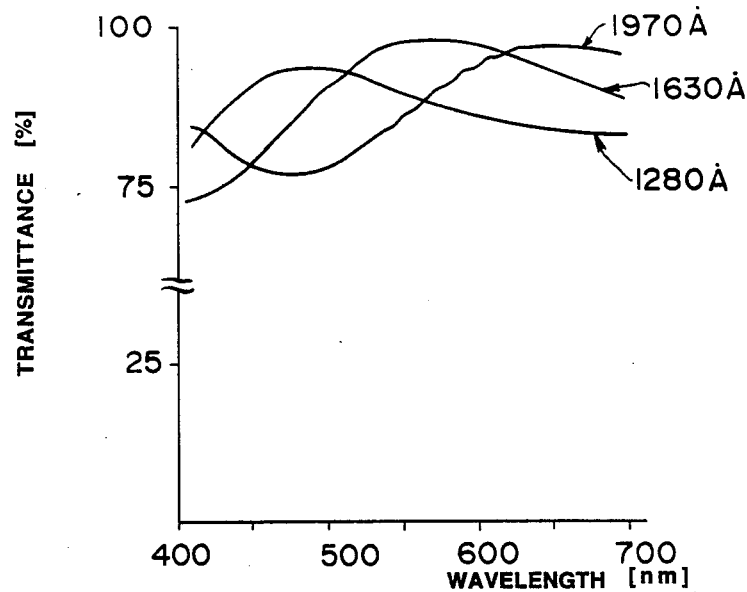
FIG. 3 *(PRIOR ART)*
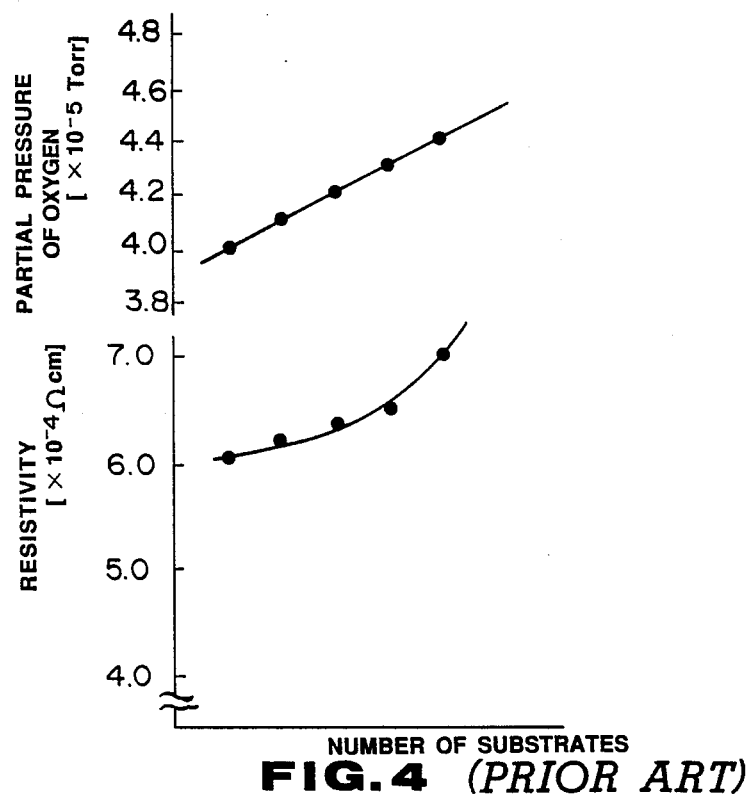
FIG. 4 *(PRIOR ART)*

METHOD OF FORMING TRANSPARENT CONDUCTIVE FILM AND APPARATUS FOR FORMING THE SAME

BACKGROUND OF THE INVENTION

1. Field of the Invention

The present invention relates to a method of forming a transparent conductive film and an apparatus for forming the same.

2. Description of the Related Art

A sputtering method is widely employed as a method of forming a transparent conductive film such as an ITO (indium-tin oxide) film on an insulating substrate such as a glass substrate.

According to the sputtering method, a gas of a Group VIII element of the periodic table (e.g., argon gas) and oxygen gas are supplied to a sputtering chamber at a predetermined mixing ratio. Sputtering is performed in the gas atmosphere while the gas mixture continuously flows in the sputtering chamber and a current supplied to a target material is kept constant, thereby depositing a transparent conductive film on the surface of the substrate.

Apparatuses for forming transparent conductive films by the sputtering method, that is, sputtering apparatuses, are classified into a batch type sputtering apparatus for performing sputtering after the transparent substrate is fixed in the sputtering chamber and an in-line type sputtering apparatus for performing continuous sputtering while the transparent substrates are sequentially fed to the sputtering chamber. The in-line sputtering apparatus is excellent in efficient formation of a large number of substrates.

In the conventional sputtering apparatus described above, even if sputtering temperature, sputtering current, argon gas flow rate, and oxygen gas flow rate are kept constant, resistivities of transparent conductive films formed on substrates vary in different cycles of the sputtering apparatus. As shown in FIG. 1, which shows a relationship between the resistivity and the oxygen flow rate when an ITO transparent conductive film is formed on a glass substrate by using an in-line sputtering apparatus, resistivities of the respective transparent conductive films continuously formed by the first operation cycle under the conditions that the sputtering temperature is 160° C., and the sputtering current and argon gas flow rate are kept constant while the oxygen gas flow rate is changed are represented by points on curve A. However, resistivities of the respective conductive films continuously formed by a second operation cycle under the condition that sputtering is started after the pressure in a pressure vessel of the sputtering apparatus is restored to atmospheric pressure are represented by curve B. That is, even if the identical sputtering conditions are set, the resistivities of the transparent conductive films are different in units of operation cycles of the sputtering apparatus, thus resulting in poor reproducibility.

When transparent conductive films are continuously formed on a large number of substrates by using an inline sputtering apparatus, resistivities of the transparent conductive files are increased when the number of substrates to be processed is large As a result, transparent conductive films having equal resistivities cannot be formed on substrates. Even if identical film formation conditions are used in an in-line sputtering apparatus, thicknesses of the transparent conductive films are decreased upon an increase in the number of substrates to be processed. As shown in FIG. 2, which shows a relationship between total discharge time and the thicknesses of the transparent conductive films under identical film formation conditions, when the number of substrates to be processed and the total discharge time are increased, the thickness of the transparent conductive film formed within a period of time assigned to one substrate is greatly decreased in the initial period and hen gradually decreased thereafter. Spectral distributions of the transparent conductive films are different from each other in units of substrates, as shown in FIG. 3, which shows the spectral distribution of light transmitted through three conductive films having thicknesses of 1,970 Å, 1,630 Å, and 1,280 Å.

SUMMARY OF THE INVENTION

The present inventors made extensive studies to solve the above problems and found that the actual partial pressure of oxygen present in the sputtering chamber was not kept constant even if flow rates of argon and oxygen gases supplied to the sputtering chamber and their mixing ratio were kept constant, and that a change in partial pressure of oxygen was a cause for the changing resistivities of transparent conductive films, thereby reaching the present invention. It is therefore an object of the present invention to provide a method of forming transparent conductive films having equal resistivities and a manufacturing apparatus using this method.

It is another object of the present invention to provide a method of forming transparent conductive films having equal thicknesses and a manufacturing apparatus using this method.

It is still another object of the present invention to provide a method of forming transparent conductive films having equal resistivities and equal thicknesses when formed on a plurality of substrates, and a manufacturing apparatus using this method.

In order to achieve the above objects of the present invention, there is provided a method of forming a transparent conductive thin film by sputtering, comprising the first step of placing a target including a conductive oxide material and a substrate on which the thin film is to be formed in a pressure vessel, the second step of substantially evacuating the pressure vessel and supplying a gas of a Group VIII element of the periodic table and oxygen gas, the third step of supplying a sputtering current to the target to maintain a discharge state, the fourth step of detecting a partial pressure of oxygen in a sputtering gas mixture filled in the pressure vessel, and the fifth step of controlling a flow rate of oxygen gas in the second step so that the partial pressure of oxygen which is detected in the fourth step is kept constant.

An apparatus for manufacturing a transparent conductive film according to the present invention uses the method described above and comprises a means for detecting the partial pressure of oxygen in a sputtering chamber and a means for controlling the flow rate of oxygen gas on the basis of information from the detecting means.

According to the method and apparatus for forming a transparent conductive film of the present invention, since the partial pressure of oxygen in the sputtering chamber is detected, and the flow rate of oxygen gas is controlled to maintain the partial pressure of oxygen constant, the resistivities of the transparent conductive films formed on the substrates can be equal to each other. Furthermore, according to the present invention, the thickness of the transparent conductive film formed on the substrate is detected, and the sputtering current is controlled such that the film formation rate is kept constant. Therefore, the thicknesses of the films to be sputtered can be kept constant regardless of the number of substrates to be processed. Moreover, according to the present invention, the flow rate of oxygen gas is controlled such that the partial pressure of oxygen in the sputtering chamber is kept constant. At the same time, the sputtering current is controlled such that the film formation rate is kept constant. Therefore, transparent conductive films having equal resistivities and equal film thicknesses can be formed.

BRIEF DESCRIPTION OF THE DRAWINGS

FIG. 3 is a graph showing the spectral distribution of transmittances depending on different thicknesses of transparent conductive films formed by conventional techniques;

FIG. 4 is a graph showing changes in resistivities and partial pressures of oxygen as a function of the number of substrates to be processed in transparent conductive films formed by conventional techniques;

DETAILED DESCRIPTION OF THE PREFERRED EMBODIMENTS

The present invention has been made based on findings of the cause for variations in resistances of transparent conductive films formed on substrates by conventional techniques.

Figure 5:
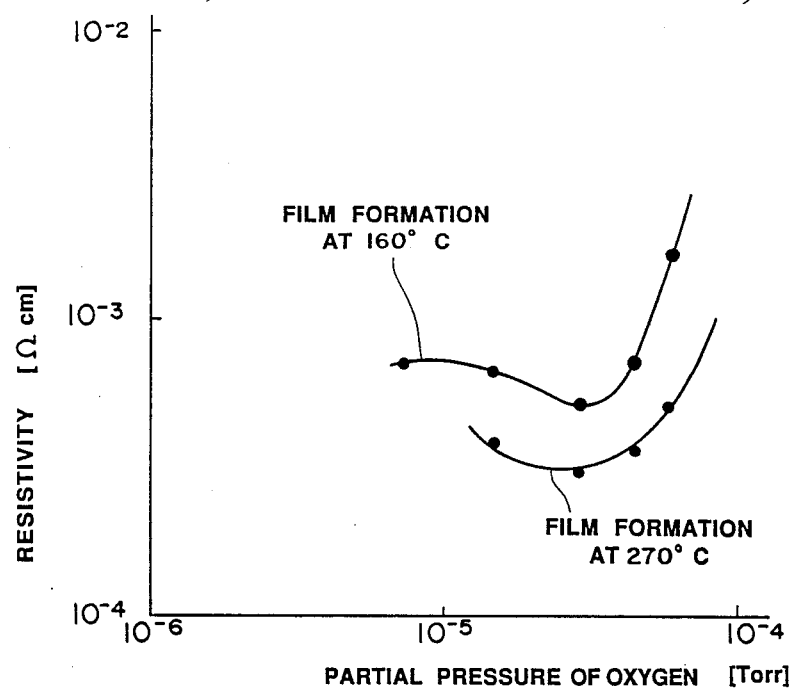
FIG. 5 is a graph showing dependency of the resistivity on the partial pressure of oxygen in a transparent conductive film formed by a first embodiment of the present invention.

When a transparent conductive film is formed on a substrate by a conventional method, the quality of the transparent conductive material sputtered from a target material and deposited on the substrate is known to be greatly influenced by oxygen contained in the gas atmosphere. For this reason, argon gas as a Group VIII element and oxygen gas are supplied in a predetermined mixing ratio. The present inventors found that the partial pressure of oxygen in the gas mixture flowing in the sputtering chamber was not always constant. In addition, in an in-line sputtering apparatus, it was found that the partial pressure of the sputtering gas was gradually increased when the number of substrates to be processed was increased, and that resistivities of transparent conductive films deposited on substrates were increased. That is, FIG. 5 shows dependency of ITO film resistivities on the partial pressures of oxygen when ITO films are formed on substrates in a gas mixture of argon and oxygen gases at 270° C. and 160° C. The sputtering discharge current is 3.3 A and the thickness of the ITO film formed on a glass substrate is 1,600 Å. As is apparent from FIG. 5, the change in resistivity of the ITO film apparently depends on the change in partial pressure of oxygen contained in the sputtering gas mixture FIG. 4 shows continuous measurement test results showing the relationship between resistivities of ITO films deposited on substrates and partial pressures of oxygen in the gas mixture flowing in the sputtering chamber when ITO films are continuously formed on a large number of substrates according to conventional techniques using the in-line sputtering apparatus. As is apparent form the FIG. 4 method, even if the mixing ratio of the gas of the Group VIII element and oxygen gas, which gases are supplied to the sputtering chamber, is set to obtain a desired resistance of a transparent conductive film formed on a substrate, the partial pressure of oxygen in the gas mixture filled in the sputtering chamber is actually changed when the number of substrates to be processed is increased. As a result, the resistances of the transparent conductive materials sputtered on substrates are changed accordingly.

According to a method of forming a transparent conductive film of the present invention, the partial pressure of oxygen in the gas mixture filled in the sputtering chamber is measured, and the flow rate of oxygen gas supplied to the sputtering chamber is controlled so that the partial pressure of oxygen in the gas mixture in the sputtering chamber is kept constant. With this control method, since the partial pressure of oxygen contained in the gas mixture in the sputtering chamber is always kept constant, the resistivities of transparent conductive films deposited on substrates by sputtering can be equal to each other.

A first embodiment of the present invention will be described in detail with reference to FIG. 6.

Figure 6:
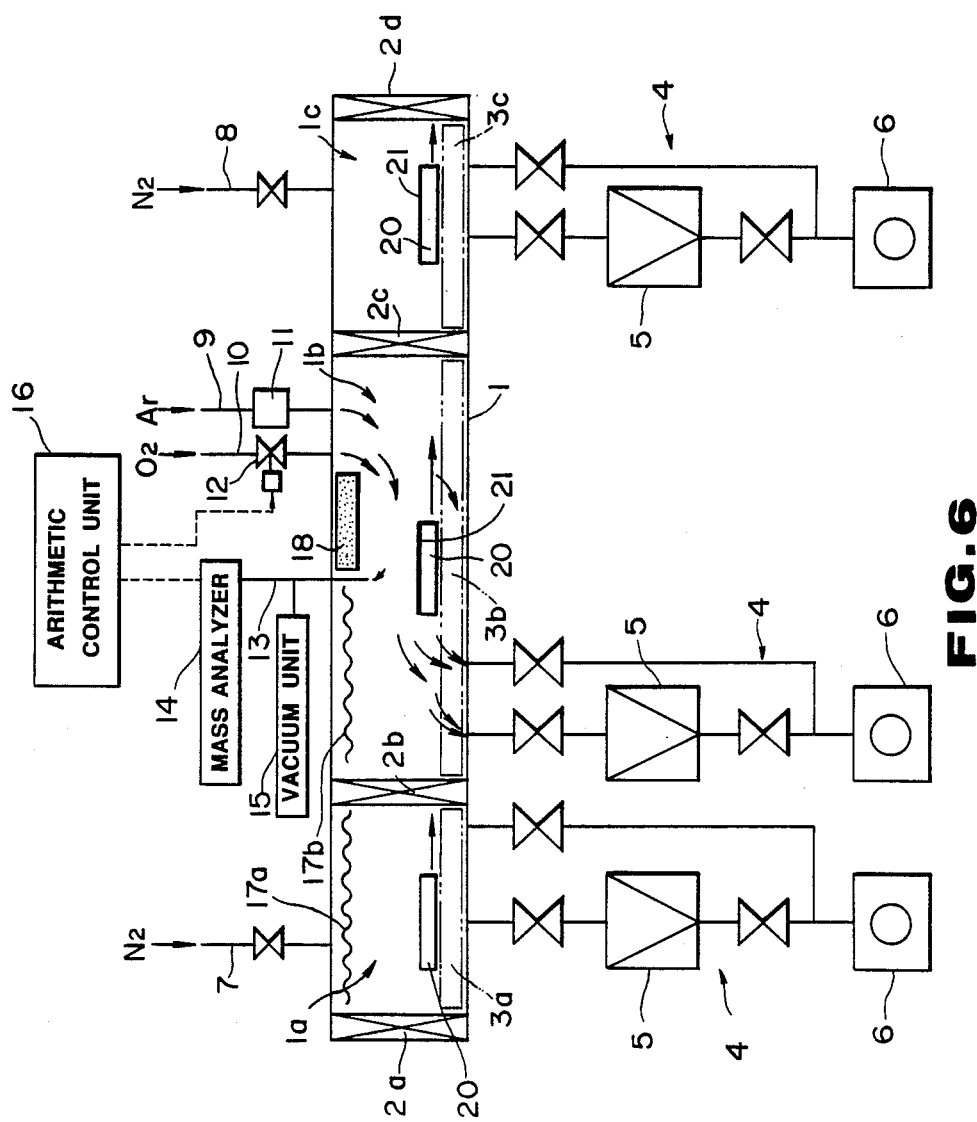
FIG. 6 is a schematic view showing the first embodiment of the present invention.

FIG. 6 shows an in-line type transparent conductive film forming apparatus. Referring to FIG. 6, reference numeral 1 denotes a hermetic (air-tight) pressure vessel. The vessel 1 is partitioned into a substrate loading chamber 1a, a sputtering chamber 1b, and a substrate unloading chamber 1c. Hermetic door valves 2a, 2b, 2c, and 2d are arranged at a substrate loading port of the loading chamber 1a, boundaries of the chambers 1a, 1b, and 1c, and a substrate unloading port of the unloading chamber 1c. Substrate conveyor units 3a, 3b, and 3c are disposed in the chambers 1a, 1b, and 1c, respectively. Reference numerals 4 denote evacuating units connected to the chambers 1a, 1b, and 1c, respectively. Each evacuating unit 4 comprises a main vacuum pump 5 (e.g., a turbo pump, a cryopump, or an oil diffusion pump) and an auxiliary pump 6 (e.g., a hydraulic rotary pump). Nitrogen gas supply pipes 7 and 8 are respectively connected to the loading and unloading chambers 1a and 1c to supply nitrogen gas ($N_2$) to the chambers. An argon gas supply pipe 9 for supplying a gas of a Group VIII element such as argon gas (Ar) and an oxygen gas supply pipe 10 for supplying oxygen gas ($O_2$) are connected to the sputtering chamber 1b. Xenon gas, neon gas, or the like may be used in place of argon gas for sputtering of a transparent conductive material. A flow control unit 11 is arranged midway along the argon gas supply pipe 9 to control the flow rate of argon gas at a predetermined value. The flow rate of argon gas (Ar) supplied from the argon gas supply pipe 9 to the sputtering chamber 1b is always kept at a predetermined value. A flow control valve 12 is arranged midway along the oxygen gas supply pipe 10. The flow rate of oxygen gas $O_2$ supplied from the oxygen gas supply pipe 10 to the sputtering chamber 1b is controlled by the flow control unit 12.

A sampling pipe 13 for receiving a mixture of argon gas and oxygen gas from the sputtering chamber 1b is connected to the sputtering chamber 1b. A mass analyzer 14 is connected to the sampling pipe 13. A commercially available quadrupole electrode mass analyzing tube is used as the mass analyzer 14. The mass analyzer 14 outputs a signal corresponding to an amount of oxygen contained in the gas mixture flowing therein. When the gas mixture supplied from the sputtering chamber 1b to the sampling pipe 13 is supplied to the mass analyzer 14, an ionic current proportional to the amount of oxygen contained in the gas mixture flows and is outputted as an output signal. Since the quadrupole electrode mass analyzing tube is not normally operated at a high vacuum of about $10^{-4}$ Torr, a vacuum unit 15 having a suction pump and the like is connected to the sampling pipe 13 to reduce the pressure of the gas supplied to the mass analyzer 14. An arithmetic control unit 16 which receives an output from the mass analyzer 14 calculates the partial pressure of oxygen in the gas mixture in the sputtering chamber 1b on the basis of the output signal from the mass analyzer 14 and controls the flow control valve 12 arranged in the oxygen gas supply pipe 10 in accordance with a difference between the calculated value and a predetermined reference partial pressure of oxygen. The flow rate of oxygen gas supplied from the oxygen gas supply pipe 10 is controlled by the arithmetic control unit 16, the mass analyzer 14, and the flow control valve 12, and the partial pressure of oxygen in the gas mixture in the sputtering chamber 1b is kept constant, thereby constituting an oxygen partial pressure control system.

Referring to FIG. 6, substrate heaters 17a and 17b are arranged in the upper portions of the loading chamber 1a and the sputtering chamber 1b, respectively. A target material 18 made of a transparent conductive material including an oxide such as ITO is arranged in the sputtering chamber 1b behind the heater 17b with respect with the direction in which the conveyor unit 3b conveys the substrate.

A method of forming a transparent conductive film in the above in-line transparent conductive film forming apparatus will be described for the case when an ITO film is formed on a glass substrate for a liquid crystal display element. Prior to formation of the ITO film, the target material 18 consisting of ITO is placed in the sputtering chamber 1b, and then all the door valves 2a, 2b, 2c, and 2d are closed to evacuate the chambers 1a, 1b, and 1c by the evacuating units 4, so that the interior spaces of the chambers 1a, 1b, and 1c are kept at a high vacuum. Nitrogen gas ($N_2$) is supplied from the nitrogen gas supply pipe 7 to the loading chamber 1a to set an internal pressure of the loading chamber 1a at atmospheric pressure. Thereafter, the loading inlet door valve 2a of the loading chamber 1a is opened, and a glass substrate 20 is set on the substrate conveyor unit 3a in the loading chamber 1a. During loading of the substrate 20 in the loading chamber 1a, nitrogen gas is kept supplied from the nitrogen gas supply pipe 7 in order to keep the loading chamber 1a in a nitrogen gas atmosphere. The loading inlet door valve 2a is closed, and the loading chamber 1a is evacuated by the evacuating unit 4 to a high vacuum. During evacuation of the loading chamber 1a to a high vacuum, the substrate 20 is kept heated by the heater 17a. When the pressure in the loading chamber 1a is reduced to a predetermined pressure (up to about $5 \times 10^{-6}$ Torr), the door valve 2b arranged between the loading chamber 1a and the sputtering chamber 1b is opened, and the substrate 20 is fed from the loading chamber 1a to the substrate conveyor unit 3b in the sputtering chamber 1b. The door valve 2b is then closed. When the door valve 2b is closed, the next substrate is loaded in the loading chamber 1a in the same manner as described above.

When the substrate 20 is fed into the sputtering chamber 1b and the door valve 2b is closed, argon gas (Ar) and oxygen gas ($O_2$) are supplied from the argon gas supply pipe 9 and the oxygen gas supply pipe 10 to the sputtering chamber 1b. The sputtering chamber 1b is filled with the mixture of argon gas (Ar) and oxygen gas ($O_2$). The pressure of the sputtering gas mixture is controlled by continuous evacuation of the gas mixture in the sputtering chamber 1b by the evacuating unit 4 such that a total pressure falls within the range of 1 mTorr to 20 mTorr while the gases are kept supplied from the argon gas supply pipe 9 and the oxygen gas supply pipe 10. Meanwhile, the substrate 20 is kept heated by the heater 17b. When the gas mixture pressure is stabilized, the substrate conveyor unit 3b feeds the substrate at a constant speed, and at the same time an RF or DC power is supplied to the target material 18, thereby starting sputter discharge.

Part of the gas mixture in the sputtering chamber 1b is always supplied to the sampling pipe 13. The gas mixture supplied to the sampling pipe 13 is evacuated by the vacuum unit 15 and is supplied to the mass analyzer 14. The mass analyzer 14 outputs a signal corresponding to the amount of oxygen in the supplied gas mixture to the arithmetic control unit 16. The arithmetic control unit 16 calculates the partial pressure of oxygen of the gas mixture in the sputtering chamber 1b on the basis of the signal from the mass analyzer 14 and compares the calculated partial pressure of oxygen with the predetermined reference partial pressure of oxygen (determined according to the desired resistance of the ITO film formed on the substrate 20). The arithmetic control unit 16 controls the flow control valve 12 arranged in the oxygen gas supply pipe 10 in accordance with the difference between the measured and predetermined reference partial pressures of oxygen. As a result, the sputtering chamber 1b is controlled such that the partial pressure of oxygen contained in the gas mixture in the sputtering chamber 1b is always kept constant (i.e., a value equal to the predetermined reference partial pressure of oxygen). The flow rate of argon gas (Ar) is controlled to be constant by the flow control unit 11 arranged in the argon gas supply pipe 9. Control of the partial pressure of oxygen is started immediately after the gas mixture pressure in the sputtering chamber 1b is stabilized at the above pressure.

When power is supplied to the target material 18 to start sputter discharge, sputtered ITO from the target material 18 is continuously deposited on the surface of the substrate 20 which is fed at a constant speed, thereby forming an ITO film 21 having a uniform thickness on the surface of the substrate 20. When the substrate 20 completely passes below the target material 18, sputter discharge is stopped, and at the same time argon gas (Ar) and oxygen gas ($O_2$) are stopped. Thereafter, the door valve 2c between the sputtering chamber 1b and the unloading chamber 1c is opened to transfer the substrate 20 having the ITO film thereon from the sputtering chamber 1b to the substrate conveyor unit 3c in the unloading chamber 1c. The door valve 2c is then closed. The substrate 20 within the loading chamber 1a is fed into the sputtering chamber 1b by opening the door valve 2b arranged between the loading chamber 1a and the sputtering chamber 1b. The door valve 2b is then closed. When the door valves 2b and 2c are closed, the sputtering chamber 1b performs the same ITO film formation described above. The substrate 20 having an ITO film thereon and supplied to the unloading chamber 1c is unloaded upon opening of the unloading port door valve 2d after nitrogen gas ($N_2$) is supplied from the nitrogen gas supply pipe 8 to the unloading chamber 1c and the internal pressure in the unloading chamber 1c is set to be atmospheric pressure. The unloading port door valve 2d is closed after the substrate 20 is unloaded, and the unloading chamber 1c is kept at a high vacuum again.

According to a method of forming the ITO film as described above, the partial pressure of oxygen in the gas mixture flowing in the sputtering chamber 1b is measured, and the flow rate of oxygen gas supplied to the sputtering chamber 1b is controlled in accordance with the measured partial pressure of oxygen. Therefore, the partial pressure of oxygen in the gas mixture in the sputtering chamber 1b is always kept constant. Therefore, the resistivities of the ITO films 21 deposited on the substrates 20 by sputtering can be kept constant, and the ITO films 21 formed on the substrates continuously fed in the sputtering chamber can have equal resistances.

Figure 7:
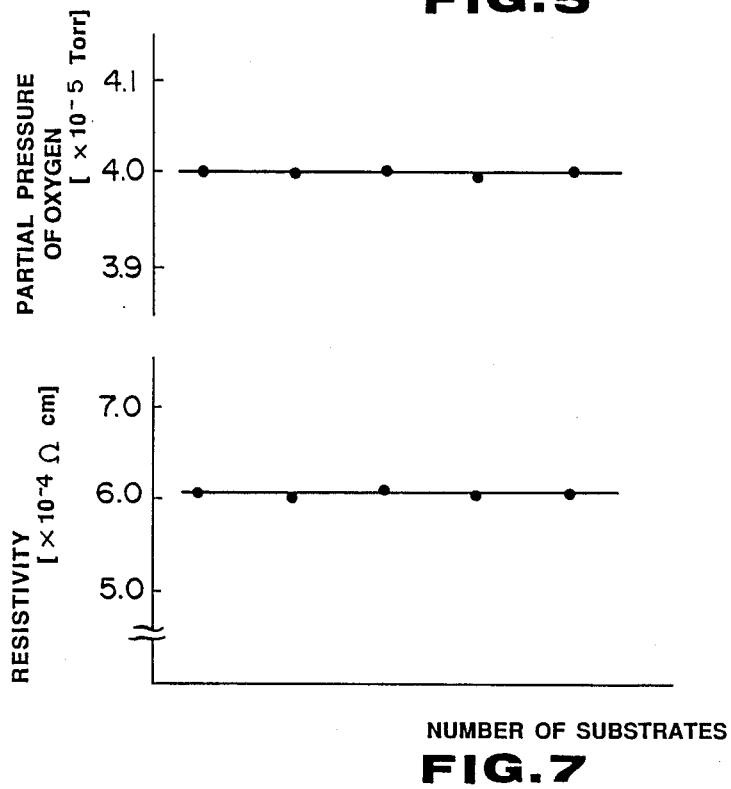
FIG. 7 is a graph showing resistivities and partial pressures of oxygen as a function of the number of substrates to be processed in the transparent conductive film formed in the first embodiment of the present invention.

FIG. 7 shows measurement results of partial pressures of oxygen contained in the gas mixture flowing in the sputtering chamber 1b and resistivities of the ITO films 21 deposited on a large number of substrates 20 when the ITO films 21 are continuously formed on the large number of substrates 20 by the above method. The sputtering temperature is 160° C., sputtering discharge current is 3.3 A, sputtering gas mixture pressure is 3 mTorr, and the thickness of each ITO film 21 formed on the glass substrate 21 is 1,600 Å. As is apparent from FIG. 7, even if the number of substrates to be processed is increased, the partial pressure of oxygen contained in the gas mixture in the sputtering chamber 1b is always kept constant according to the above method. Therefore, the ITO films 21 formed on the substrates 20 are always uniform films having a predetermined resistance.

In the apparatus for forming the transparent conductive film, as described above, the gas mixture in the sputtering chamber 1b is sampled by the sampling pipe 13 to measure the actual partial pressure of oxygen in the gas mixture, and at the same time, the flow rate of oxygen gas from the oxygen gas supply pipe 10 is controlled in accordance with the difference between the measured partial pressure of oxygen and the reference partial pressure of oxygen. Therefore, the partial pressure of oxygen in the gas mixture in the sputtering chamber 1b can always be kept constant. When this apparatus is used, the method of forming the transparent conductive film having stable characteristics can be practiced.

The present invention is also applicable to a transparent conductive oxide film such as a ZnO or $SnO_2$ film in addition to an ITO film. The present invention is further applicable to a batch film forming apparatus in addition to an in-line film forming apparatus.

Figure 1:
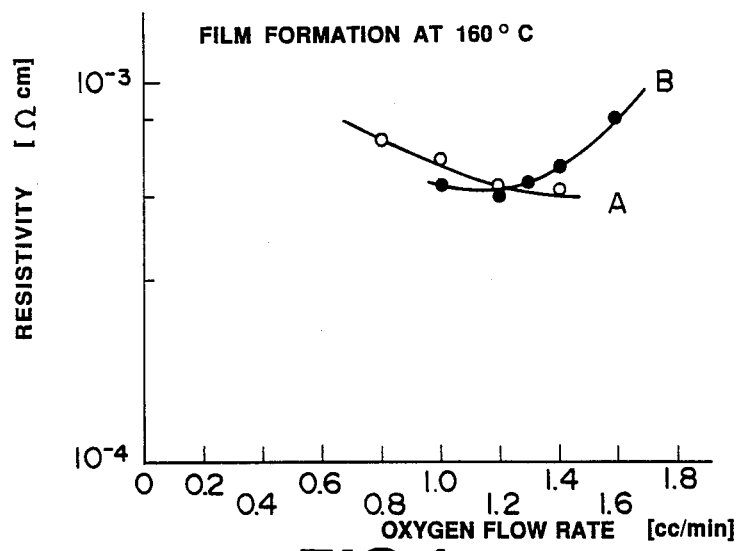
FIG. 1 is a graph showing dependency of the resistivity on the oxygen flow rate in a transparent conductive film formed by conventional techniques.
Figure 2:
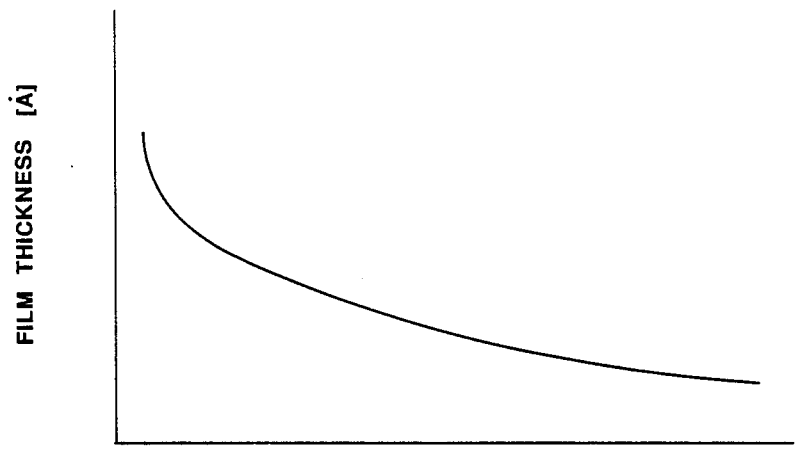
FIG. 2 is a graph showing changes in film thicknesses as a function of total discharge time in transparent conductive films formed by conventional techniques.

According to the first embodiment described, transparent conductive films having equal resistivities can be formed. As shown in FIGS. 2 and 3, when the total discharge time, i.e., the number of processed substrates, is increased, the thicknesses of the transparent conductive films vary even if the film formation time of each substrate is kept unchanged.

According to the present invention, a method of forming transparent conductive films having a constant film formation rate is provided, and an apparatus for forming the same is also provided. A second embodiment of the present invention will be described in detail with reference to FIG. 8. The same reference numerals as in the first embodiment denote the same parts in the second embodiment, and a detailed description thereof will be omitted.

Figure 8:
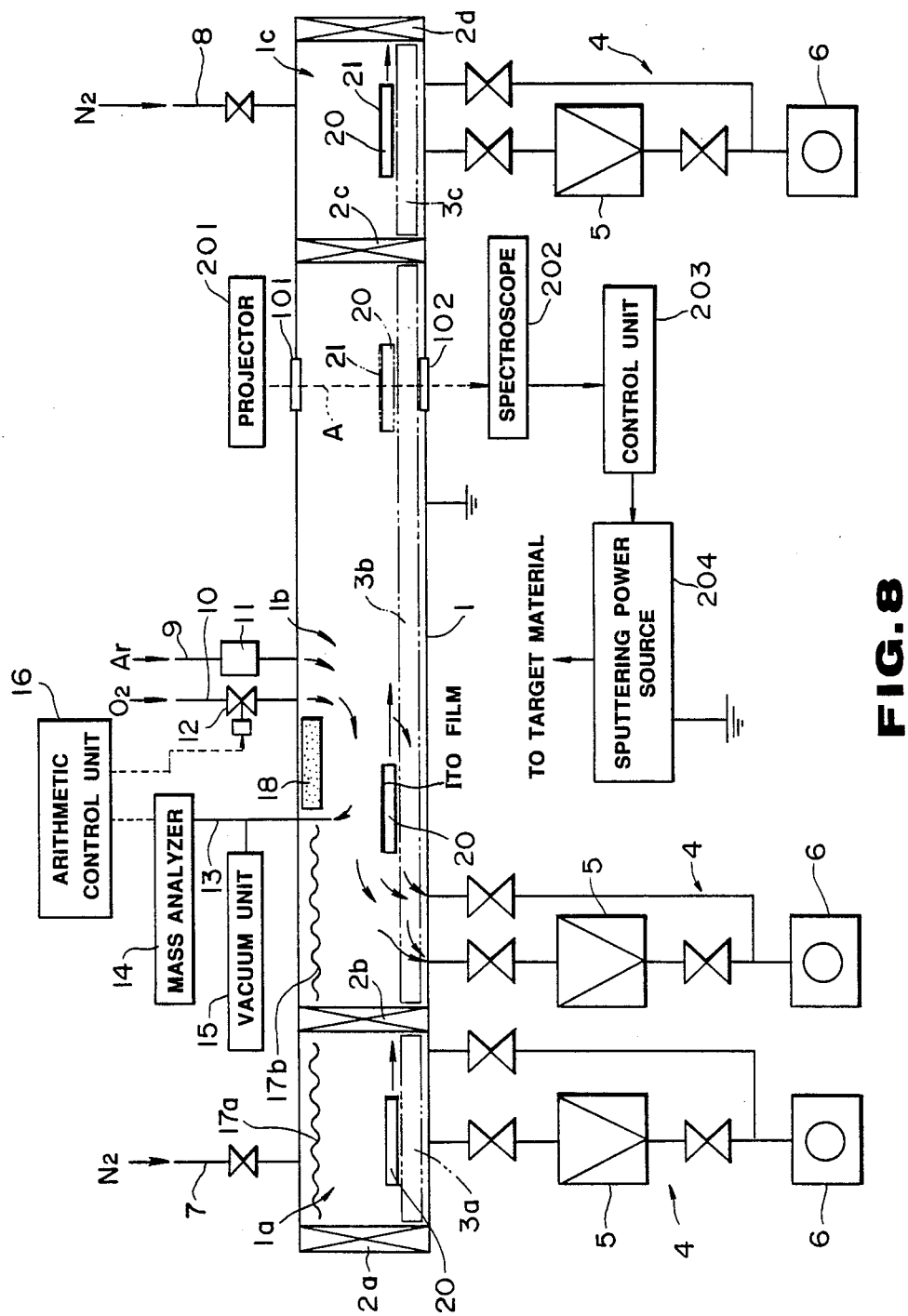
FIG. 8 is a schematic view showing a second embodiment of the present invention.

The second embodiment shown in FIG. 8 includes a detector for detecting the thickness of a transparent conductive film formed on a substrate and a controller for controlling the sputtering current on the basis of the detected thickness in addition to the arrangement of the first embodiment shown in FIG. 6.

Referring to FIG. 8, transparent windows 101 and 102 consisting of pressure-resistant glass are formed at upper and lower surface positions of a rear portion (near a substrate unloading chamber 1c) of a sputtering chamber 1b. These positions are spaced part from the position of the target material 18 by an appropriate distance in the substrate conveyor direction. A projector 201 and a spectroscope 202 outside the sputtering chamber 1b respectively oppose the transparent windows 101 and 102. The projector 201 projects a beam A onto transparent conductive film 21 on transparent substrate 20 on which the transparent conductive film 21 is formed while the substrate 20 is being conveyed. The projector 201 includes a light source having a high-intensity lamp such as a halogen or xenon lamp for emitting a high-intensity beam. The spectroscope 202 receives a beam projected from the projector 201 onto the transparent conductive film 21 and transmitted through the transparent conductive film 21 and the transparent substrate 20. The spectroscope 202 measures a spectral distribution of this beam. An output from the spectroscope 202 is supplied to a control unit 203. The control unit 203 measures the thickness of the transparent conductive film 21 formed on the surface of the substrate 20 in accordance with a wavelength corresponding to a minimum or maximum value of the spectral distribution measured by the spectroscope 202 and controls sputtering power source 204 for supplying sputtering current to the target material 18 in accordance with the determined thickness. The current supplied from the sputtering power source 204 to the target material 18 is controlled by the control unit 203.

Figure 9:
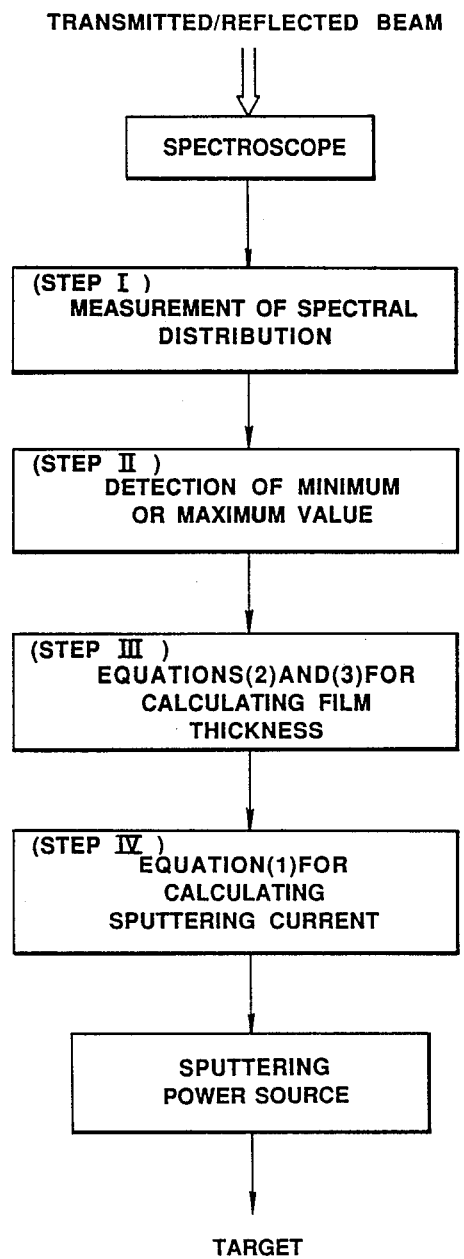
FIG. 9 is a flow chart showing functional blocks for controlling the sputtering current in the second embodiment shown in FIG. 8.

Sputtering current control will be described with reference to FIGS. 8 and 9. When the substrate 20 having the ITO film 21 thereon is conveyed between the projector 201 and the spectroscope 202 in the sputtering chamber 1b, the projector 201 projects a beam onto the ITO film 21 on the surface of the substrate 20. The beam projected from the projector 201 is transmitted through the ITO film 21 and the substrate 20 and is incident on the spectroscope 202. The spectral distribution of the transmitted beam is measured by the spectroscope 202. An output from the spectroscope 202 is supplied to the control unit 203. The control unit 203 cancels influences (prestored in the control unit 203) of the substrate 20 and the transparent windows 101 and 102 from the spectral distribution measured by the spectroscope and calculates a spectral distribution of only the ITO film 21 (step I in FIG. 9). The control unit 203 detects a wavelength corresponding to the maximum or minimum transmittance on the basis of the calculated spectral distribution (step II in FIG. 9). Subsequently, the control unit 203 calculates a thickness d of the ITO film 21 on the surface of the substrate 20 in accordance with a prestored relation (to be described later) between the thickness and the wavelength (step III in FIG. 9). The control unit 203 calculates a sputtering current I to be updated on the basis of the calculated thickness d. The sputtering current I to be updated is defined as follows:

$$I = I_0 \cdot d_0 / d \quad (1)$$

where $d_0$ is a target thickness of the ITO film 21 and $I_0$ is a present sputtering current (step IV in FIG. 9). The control unit 203 supplies a sputtering current control signal to the sputtering power source 204, and the sputtering power source 204 supplies the sputtering current I to the target material 18.

Formation of the ITO film 21 to be formed on the next substrate 20 to be fed in the sputtering chamber 1b is controlled by the sputtering current I controlled in accordance with the thickness of the ITO film 21 of the present substrate 20.

In the method of forming the transparent conductive film described above, the current supplied to the target material 18 is controlled on the basis of a change in thickness of the ITO film 21 formed on the surface of the substrate 21. The next sputtering current is changed so that the thickness d of the ITO film 21 formed on the next substrate 21 is set to be the desired film thickness. According to this method, a decrease in thickness of the ITO film 26 formed on the substrate 20 upon an increase in a lapse of the total discharge time can be prevented. Therefore, the ITO films 21 having a uniform thickness can be formed on the large number of substrates 20 continuously fed in the sputtering chamber 1b.

The prestored relation between the thickness and the wavelength in the control unit 203 will be described below.

The transmission spectral characteristics of the ITO film 21 formed on the surface of the transparent substrate 20 are generally given as follows:

$$T = (8 n_s \cdot n_f^2) / \{ (n_s^2 + n_f^2) \cdot (n_f^2 + 1) + 4 n_s n_f^2 + (n_s^2 - n_f^2) \cdot (n_f^2 - 1) \cos A \} \quad (2)$$

for $A = (4 \pi n_f d) / \lambda$
where
  T: transmittance
  $n_f$: refractive index of the ITO film 21
  $n_s$: refractive index of the transparent substrate 20
  $\lambda$: wavelength
  d: thickness of the ITO film 21

When dependency of the refractive indices $n_s$ and $n_f$ on the wavelength is neglected, the relation between the thickness d and the wavelength $\lambda$ to minimize or maximize the transmittance T is given as follows:

$$d = (a / 4 n_f) \lambda \quad (3)$$

(a = 0, 1, 2, ...)
The relation between the thickness d and the wavelength $\lambda$ is given as a linear relation from equation (3).

Figure 10:
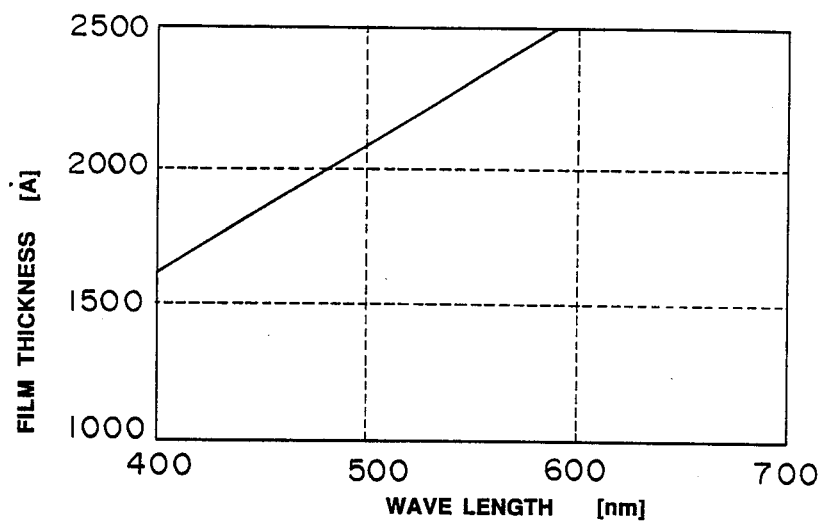
FIG. 10 is a graph showing a relationship between film thicknesses and minimum values in a spectral distribution of light transmitted through or reflected by the transparent conductive film in the second embodiment shown in FIG. 8.

FIG. 10 is a graph showing the relationship between the wavelength and the film thickness to give a minimum value.

Since equations (1) to (3) are inputted to the control unit 203, the next discharge current to set the thickness d of the ITO film 21 on the next substrate 20 to be a desired film thickness can be controlled in accordance with a change in thickness of the ITO film 21 of the surface of the present substrate 20.

In addition, in the method of forming the transparent conductive film, the partial pressure of oxygen contained in the gas mixture flowing in the sputtering chamber 1b is measured, and the flow rate of oxygen gas supplied to the sputtering chamber 1b is controlled in accordance with the measured partial pressure. Therefore, sputtering is performed while the partial pressure of oxygen in the gas mixture in the sputtering chamber 1b is always kept constant. The resistivities of the ITO films 21 deposited on the substrates 20 by sputtering can be kept constant, and the ITO films 21 having equal resistances can be formed on the substrates 21 continuously fed in the sputtering chamber 1b.

Figure 11:
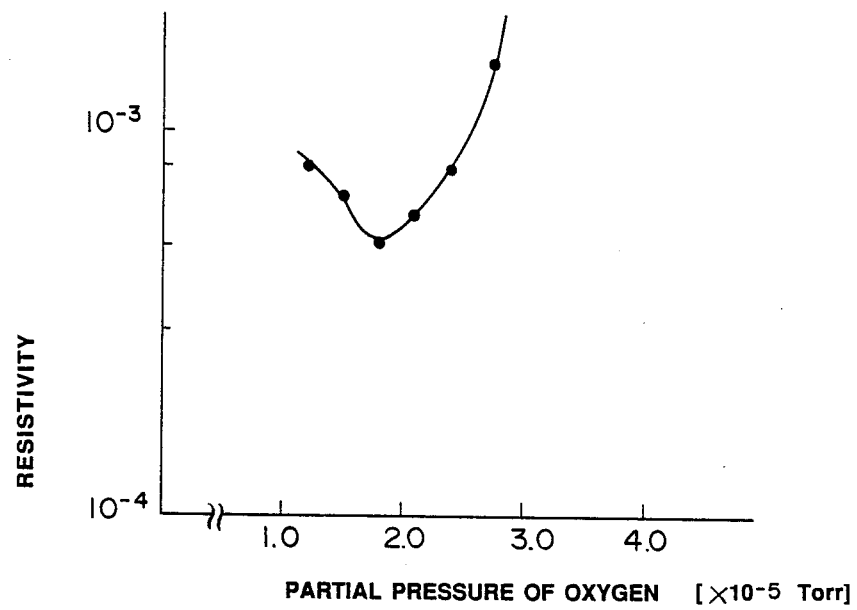
FIG. 11 is a graph showing the resistivity of a transparent conductive film as a function of the partial pressure of oxygen.

FIG. 11 shows the relationship between the partial pressure of oxygen and the resistivity of the ITO film 21 when the ITO film 21 is formed on the surface of the substrate 20 while the partial pressure of oxygen contained in the gas mixture in the sputtering chamber 1b is always kept constant. When the partial pressure of oxygen is kept constant, the ITO films 21 have equal resistivities. The results in FIG. 11 are obtained when the sputtering temperature is 160° C., the gas mixture pressure is 3 mTorr, the discharge current is 4.2 A, and an ITO film having a thickness of 1,800 Å is formed.

According to the method of forming the transparent conductive film as described above, the current supplied to the target material 18 is controlled in accordance with a change in thickness of the ITO film 21 formed on the substrate 20. The sputtering current is changed so that the thickness of the ITO film is set to be the desired thickness. Therefore, ITO films 21 having equal thicknesses can be formed on the large number of substrates 20. In addition, since sputtering is performed while the partial pressure of oxygen in the sputtering chamber 1b is always kept constant, ITO films 21 having equal resistances are formed on the large number of substrates 20.

Figure 12:
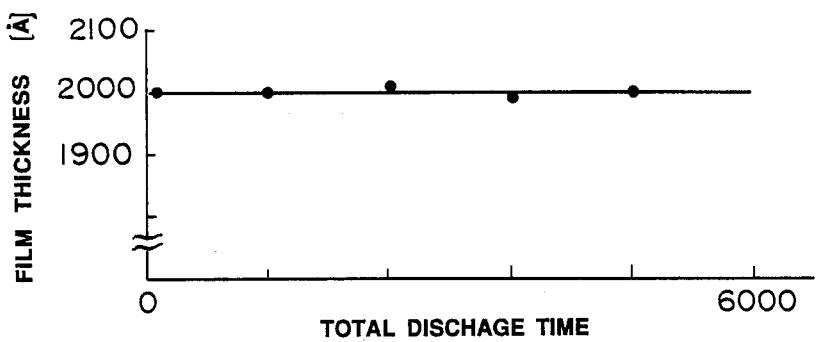
FIG. 12 is a graph showing the film thickness as a function of total discharge time in the transparent conductive film formed by the second embodiment shown in FIG. 8.
Figure 13:
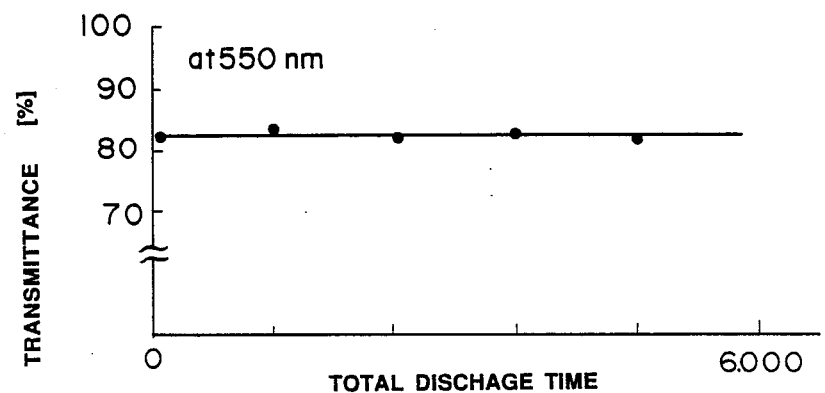
FIG. 13 is a graph showing the transmittance of light having a wavelength of 550 nm as a function of the total discharge time in the transparent conductive film formed in the second embodiment shown in FIG. 8.
Figure 14:
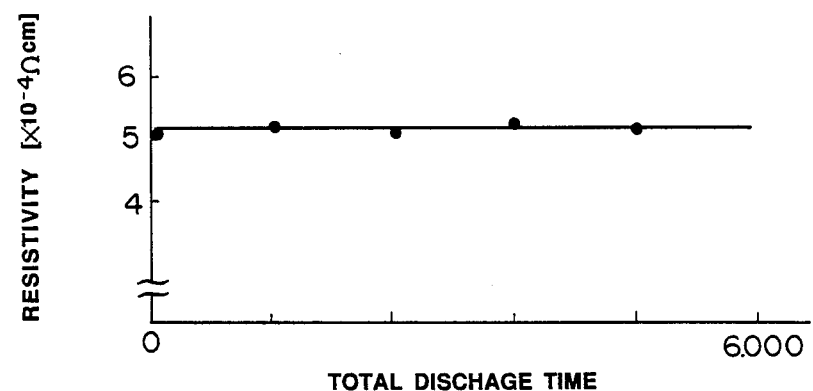
FIG. 14 is a graph showing the resistivity as a function of the total discharge time in the transparent conductive film formed in the second embodiment shown in FIG. 8.

FIGS. 12 to 14 show measurement results of changes in thickness, transmittance, and resistivity of the ITO film as a function of the total discharge time when the ITO film 21 is formed on the substrate 20 by the above method. The thickness of the ITO film 21 is kept uniform regardless of a change in total discharge time, as shown in FIG. 12. The transmittance of the ITO film 21 is kept constant regardless of a change in total discharge time, as shown in FIG. 13. The resistivity of the ITO film 21 is also kept constant regardless of a change in total discharge time, as shown in FIG. 14.

In the above embodiment, the thickness of the ITO film 21 formed on the substrate 20 is measured to control the next sputtering current. Since a change in ITO film deposition rate within a period required to form the ITO films 21 on several to several tens of substrates 20 is very small, control of the sputtering current may be performed every cycle for forming the ITO films 21 on several to several tens of substrates 20. In this case, a change in ITO film deposition rate is gradually reduced with an increase in total discharge time. Therefore, discharge current control and film thickness measurements are frequently performed during the initial period, and time intervals for discharge current control and film thickness measurements may be gradually increased.

In the above embodiment, the thickness of the ITO film 21 is measured by using a beam transmitted therethrough. However, the film thickness measurement may be performed by using a beam reflected by the ITO film 21. In this case, the spectroscope is arranged in parallel with the projector 201, and the beam reflected by the surface of the ITO film 21 is measured by the spectroscope 202. The thickness of the ITO film 21 may be calculated by the spectral distribution of the reflected beam.

In the above embodiments, formation of an ITO film is exemplified. However, the present invention is also applicable to formation of a transparent conductive oxide film, e.g., a ZnO or $SnO_2$ transparent conductive film besides the ITO film.

What is claimed is:

1. A method of forming a transparent conductive thin film by sputtering, comprising:
    a first step of placing a target including a conductive oxide material and a substrate on which a thin film is to be formed, in a pressure vessel;
    a second step of substantially evacuating the pressure vessel and supplying a sputtering gas mixture comprising a gas of a Group VIII element of the periodic table and oxygen gas;
    a third step of supplying a sputtering current to the target to maintain a discharge state;
    a fourth step of detecting the partial pressure of oxygen in the sputtering gas mixture filled in the pressure vessel;
    a fifth step of controlling the flow rate of oxygen gas in the second step so that the partial pressure of oxygen which is detected in the fourth step is kept substantially constant;
    a sixth step of detecting a thickness of the transparent conductive thin film deposited on the substrate; and
    a seventh step of controlling the sputtering current supplied to the target such that the final thickness of said film detected in the sixth step is controlled to be a substantially constant predetermined value.

2. A method according to claim 1, wherein the fourth step comprises: the substep of detecting an ionic current corresponding to the partial pressure of oxygen by a quadrupole electrode mass analyzing tube for receiving the sputtering gas mixture in the pressure vessel; and the substep of calculating the partial pressure of oxygen by an arithmetic control unit on the basis of the detected ionic current.

3. A method according to claim 2, wherein the fifth step comprises: the substep of comparing the partial pressure of oxygen detected in the fourth step and a reference partial pressure of oxygen prestored in the arithmetic control unit and calculating a difference therebetween; and the substep of controlling the flow rate of oxygen gas on the basis of the difference.

4. A method according to claim 1, wherein the sixth step comprises the step of optically measuring the thickness.

5. A method according to claim 1, wherein the sixth step comprises: the substep of measuring a spectral distribution of a beam transmitted through the thin film formed on the substrate; the substep of detecting a wavelength representing a minimum or maximum value of the spectral distribution; and the substep of calculating the thickness of the thin film on the basis of the wavelength representing the minimum or maximum value.

6. A method according to claim 1, including forming films on a number of substrates fed in line through the pressure vessel.

7. A method of forming a transparent conductive thin film by sputtering, comprising:
    a step of placing a target including a conductive oxide material in a pressure vessel;
    a step of substantially evacuating the pressure vessel;
    a step of feeding a substrate on which the thin film is to be formed into the pressure vessel;
    a step of supplying a sputtering gas mixture comprising a gas of a Group VIII element of the periodic table and oxygen gas in the pressure vessel;
    a step of supplying a sputtering current to the target to maintain a discharge state;
    a step of detecting the a partial pressure of oxygen of the sputtering gas mixture filled in the pressure vessel;
    a step of controlling a flow rate of oxygen gas in the gas supply step so that the partial pressure of oxygen detected in the step of detecting the partial pressure of oxygen is kept constant;
    a step of detecting the thickness of the transparent conductive thin film deposited on the substrate;
    a step of controlling the sputtering current supplied to the target such that the final thickness of said film detected by the film thickness detection step is controlled to a substantially constant predetermined value; and
    a step of unloading the substrate having the thin film thereon from the pressure vessel,
    wherein the thin film forming step including at least the substrate feed step, the gas supply step, the discharge maintaining step, and the substrate unloading step is repeated a plurality of times to continuously form transparent conductive thin films on a large number of substrates.

8. A method according to claim 7, wherein the film thickness detection step comprises: the substep of measuring a spectral distribution of a beam transmitted through the thin film deposited on the substrate; the substep of detecting a wavelength representing a minimum or maximum value of the spectral distribution; and the substep of calculating the thickness of the thin film on the basis of the wavelength representing the minimum or maximum value.

9. A method according to claim 7, wherein the film thickness detection step comprises: the substep of measuring a spectral distribution of a beam reflected by the thin film deposited on the substrate; the substep of detecting a wavelength representing a minimum or maximum value of the spectral distribution; and the substep of calculating the thickness of the thin film on the basis of the wavelength representing the minimum or maximum value.

10. A method according to claim 7, wherein the sputtering current control step comprises: the substep of calculating a sputtering current to be updated on the basis of the thickness detected in the film thickness detection step; and the substep of setting the output current of a sputtering power source to the calculated value of the sputtering current.

11. A method according to claim 7, wherein the film thickness detection step and the sputtering current control step are executed every formation cycle of one substrate.

12. A method according to claim 7, wherein the film thickness detection step and the sputtering current control step are performed every plurality of formation cycles.

13. A method according to claim 12, wherein the film thickness detection step and the sputtering current control step have a low frequency when the number of film formation steps is increased.

14. An apparatus for forming a transparent conductive thin film, comprising:
a vacuum pump;
a pressure vessel, connected to said vacuum pump and arranged for evacuation by said vacuum pump to exhaust internal gas therefrom;
a target placed in said pressure vessel and including a conductive oxide material;
means for feeding a substrate into said pressure vessel and on which substrate the transparent conductive thin film is to be formed;
a sputtering power source, connected to said target, for supplying a sputtering current thereto;
sputtering gas supply means for supplying a gas of a Group VIII element of the periodic table to said pressure vessel;
oxygen gas supply means for supplying oxygen gas to said pressure vessel;
oxygen gas detecting means for detecting the partial pressure of oxygen in the sputtering gas mixture filled in said pressure vessel;
control means for controlling the flow rate of oxygen gas supplied from said oxygen gas supply means such that the partial pressure of oxygen detected by said oxygen gas detecting means is controlled to be substantially constant;
film thickness detecting means for optically detecting the thickness of the thin film deposited on said substrate; and
current control means for controlling the sputtering current supplied from said sputtering power source to said target such that the final thickness of said film detected by said film thickness detecting means is controlled to be a substantially constant predetermined value.

15. An apparatus according to claim 14, wherein said film thickness detecting means comprises: means for measuring a spectral distribution of a beam transmitted through the thin film; means for detecting a wavelength representing a minimum or maximum value of the spectral distribution; and means for calculating the thickness of the thin film on the basis of the wavelength representing the minimum or maximum value.

16. An apparatus according to claim 14, wherein said current control means comprises: means for calculating a sputtering current to be updated on the basis of the thickness detected by said film thickness detecting means; and means for setting an output current of said sputtering power source to a value of the calculated sputtering current.

17. An apparatus according to claim 14, further comprising: a loading pressure vessel, connected to said pressure vessel through a sealing door, for loading said substrate into said pressure vessel; an unloading pressure vessel, connected to said pressure vessel through a sealing door, for unloading said substrate having the thin film thereon from said pressure vessel; and transfer means for sequentially transferring said substrate inside said loading pressure vessel, said pressure vessel, and said unloading pressure vessel,
wherein a plurality of substrates are sequentially fed by said transfer means to continuously form transparent conductive thin films on a large number of substrates.

18. An apparatus according to claim 14, wherein said target consists of indium-tin oxide, and a low-resistive indium-tin oxide transparent conductive film is formed on said substrate.

* * * * *